United States Patent
Zhou et al.

(10) Patent No.: US 10,074,817 B2
(45) Date of Patent: Sep. 11, 2018

(54) THIN FILM TRANSISTOR ARRAY PANEL AND METHOD OF FABRICATING THE SAME

(71) Applicant: SHENZEN CHINA STAR OPTOELECTRONICS TECHNOLOGY CO., LTD., Guangdong (CN)

(72) Inventors: Zhichao Zhou, Guangdong (CN); Hui Xia, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 114 days.

(21) Appl. No.: 15/123,147

(22) PCT Filed: May 10, 2016

(86) PCT No.: PCT/CN2016/081564
§ 371 (c)(1),
(2) Date: Sep. 1, 2016

(87) PCT Pub. No.: WO2017/177493
PCT Pub. Date: Oct. 19, 2017

(65) Prior Publication Data
US 2018/0097190 A1    Apr. 5, 2018

(30) Foreign Application Priority Data

Apr. 13, 2016 (CN) .......................... 2016 1 0226945

(51) Int. Cl.
*H01L 27/32* (2006.01)
*H01L 51/05* (2006.01)
(Continued)

(52) U.S. Cl.
CPC ...... *H01L 51/0508* (2013.01); *H01L 27/1225* (2013.01); *H01L 27/1259* (2013.01);
(Continued)

(58) Field of Classification Search
None
See application file for complete search history.

(56) References Cited

U.S. PATENT DOCUMENTS 9,437,750 B1 * 9/2016 Fang ................. H01L 29/78696
9,490,310 B2 11/2016 Li et al.
(Continued)

FOREIGN PATENT DOCUMENTS

CN   104037129 A   9/2014
CN   105390507 A   3/2016

*Primary Examiner* — Thao P Le
(74) *Attorney, Agent, or Firm* — WPAT, PC

(57) ABSTRACT

A thin film transistor array panel and a method of fabricating the same are described. The thin film transistor array panel has: a substrate; a gate electrode; a semiconductor layer; a source electrode; a drain electrode; an insulating layer; an etch stop layer disposed on the semiconductor layer and the insulating layer; a first electrode portion disposed on the source electrode for covering and protecting the source electrode; a second electrode portion disposed on the drain electrode for covering and protecting the drain electrode. Thus, the fabricating process can be simplified and the fabricating cost is reduced.

15 Claims, 3 Drawing Sheets

(51) Int. Cl.
*H01L 27/12* (2006.01)
*H01L 29/768* (2006.01)
*H01L 29/66* (2006.01)
*H01L 29/786* (2006.01)

(52) U.S. Cl.
CPC .... *H01L 27/3262* (2013.01); *H01L 29/66765* (2013.01); *H01L 29/768* (2013.01); *H01L 29/78618* (2013.01)

(56) References Cited

U.S. PATENT DOCUMENTS

| | | | |
|---|---|---|---|
| 2004/0124417 A1 | 7/2004 | So | |
| 2010/0006833 A1* | 1/2010 | Ha | H01L 29/7869 257/43 |
| 2014/0217399 A1* | 8/2014 | Wu | H01L 27/14603 257/43 |
| 2015/0162489 A1* | 6/2015 | Kao | H01L 21/707 257/43 |
| 2016/0351719 A1* | 12/2016 | Shih | H01L 29/78606 |
| 2017/0110527 A1* | 4/2017 | Li | H01L 27/3262 |
| 2017/0323906 A1* | 11/2017 | Yamaguchi | H01L 27/1225 |
| 2018/0033848 A1* | 2/2018 | Jung | H01L 27/3272 |

* cited by examiner

THIN FILM TRANSISTOR ARRAY PANEL AND METHOD OF FABRICATING THE SAME

FIELD OF THE INVENTION

The present invention relates to a display technique field, and more particularly to a thin film transistor array panel and a method of fabricating the same.

BACKGROUND OF THE INVENTION

In general, six mask processes are required in a conventional thin film transistor array panel.

The above conventional thin film transistor array panel generally has a protective layer/a passivation layer. A production of the protective layer/the passivation layer needs to consume one of the mask processes.

Therefore, the above conventional thin film transistor array panel has a relatively complex fabricating process and a relatively high cost.

As a result, it is necessary to provide a new technical solution to solve the technique problems above.

SUMMARY OF THE INVENTION

An object of the present invention is to provide a thin film transistor array panel and a method of fabricating the same, which can simplify the fabricating process of the thin film transistor array panel and reduce the fabricating cost.

To achieve the above object, the present invention provides a technical solution as follows.

A thin film transistor array panel, comprising: a substrate; a thin film transistor, comprising: a gate electrode; a semiconductor layer; a source electrode; and a drain electrode; an insulating layer disposed on the gate electrode and the substrate; an etch stop layer disposed on the semiconductor layer and the insulating layer; an electrode layer, comprising a first electrode portion and a second electrode portion, wherein the first electrode portion is disposed on the source electrode and configured to cover and protect the source electrode, and the second electrode portion is disposed on the drain electrode and configured to cover and protect the drain electrode; wherein the semiconductor layer is disposed on the insulating layer, the etch stop layer has a first through hole and a second through hole, and the source electrode and the drain electrode are connected with the semiconductor layer through the first through hole and the second through hole respectively; wherein the gate electrode is formed by disposing a first metal layer on the substrate and performing a first mask process on the first metal layer; wherein the semiconductor layer is formed by disposing a semiconductor material on the insulating layer and performing a second mask process to the semiconductor material; wherein the first through hole and the second through hole are formed by disposing an etch stop material on the insulating layer and the semiconductor layer and performing a third mask process on the etch stop material; wherein the source electrode, the drain electrode and the electrode layer are formed by disposing a second metal layer on the etch stop layer, in the first through hole and in the second through hole, respectively, then disposing a third metal layer on the second metal layer and performing a fourth mask process on the second metal layer and the third metal layer, wherein the source electrode and the drain electrode are both corresponding to the second metal layer, and the first electrode portion and the second electrode portion of the electrode layer are both corresponding to the third metal layer; and wherein a channel between the source electrode and the drain electrode is configured to isolate a first entirety constructed by the source electrode and the first electrode portion from a second entirety constructed by the drain electrode and the second electrode portion.

In the above thin film transistor array panel, the thin film transistor array panel further comprises receiving cavities formed in the etch stop layer, wherein the receiving cavities are configured to receive at least one part of the source electrode, at least one part of the drain electrode and at least one part of the electrode layer.

In the above thin film transistor array panel, the receiving cavities are formed by performing the third mask process on the etch stop material.

In the above thin film transistor array panel, the semiconductor layer comprises indium gallium zinc oxide.

In the above thin film transistor array panel, the etch stop layer is configured to protect the semiconductor layer from water vapor or oxygen gas affecting an electrical stability of the indium gallium zinc oxide.

In the above thin film transistor array panel, the channel is formed by performing the fourth mask process to the second metal layer and the third metal layer, and etching the second metal layer and the third metal layer.

A thin film transistor array panel, comprising: a substrate; a thin film transistor, comprising: a gate electrode; a semiconductor layer; a source electrode; and a drain electrode; an insulating layer disposed on the gate electrode and the substrate; an etch stop layer disposed on the semiconductor layer and the insulating layer; an electrode layer, comprising a first electrode portion and a second electrode portion, wherein the first electrode portion is disposed on the source electrode and configured to cover and protect the source electrode, and the second electrode portion is disposed on the drain electrode and configured to cover and protect the drain electrode; and wherein the semiconductor layer is disposed on the insulating layer, the etch stop layer has a first through hole and a second through hole, and the source electrode and the drain electrode are connected with the semiconductor layer through the first through hole and the second through hole respectively.

In the above thin film transistor array panel, the gate electrode is formed by disposing a first metal layer on the substrate and performing a first mask process on the first metal layer; wherein the semiconductor layer is formed by disposing a semiconductor material on the insulating layer and performing a second mask process on the semiconductor material; wherein the first through hole and the second through hole are formed by disposing an etch stop material on the insulating layer and the semiconductor layer and performing a third mask process on the etch stop material; and wherein the source electrode, the drain electrode and the electrode layer are formed by disposing a second metal layer on the etch stop layer, in the first through hole and in the second through hole, respectively, then disposing a third metal layer on the second metal layer and performing a fourth mask process to the second metal layer and the third metal layer, wherein the source electrode and the drain electrode are both corresponding to the second metal layer, and the first electrode portion and the second electrode portion of the electrode layer are both corresponding to the third metal layer.

In the above thin film transistor array panel, the thin film transistor array panel further comprises receiving cavities formed in the etch stop layer, wherein the receiving cavities are configured to receive at least one part of the source electrode, at least one part of the drain electrode, and at least one part of the electrode layer.

In the above thin film transistor array panel, the receiving cavities are formed by performing the third mask process on the etch stop material.

In the above thin film transistor array panel, the semiconductor layer comprises indium gallium zinc oxide.

In the above thin film transistor array panel, the etch stop layer is configured to protect the semiconductor layer from water vapor or oxygen gas affecting an electrical stability of the indium gallium zinc oxide.

In the above thin film transistor array panel, a channel between the source electrode and the drain electrode is configured to isolate a first entirety constructed by the source electrode and the first electrode portion from a second entirety constructed by the drain electrode and the second electrode portion.

In the above thin film transistor array panel, the channel is formed by performing the fourth mask process to the second metal layer and the third metal layer, and etching the second metal layer and the third metal layer.

A method of fabricating a thin film transistor array panel described above, wherein the method comprises the following steps of: (A) disposing a first metal layer on the substrate, and performing a first mask process to the first metal layer for forming the gate electrode; (B) disposing the insulating layer on the substrate and the gate electrode; (C) disposing a semiconductor material on the insulating layer, and performing a second mask process on the semiconductor material for forming the semiconductor layer; (D) disposing an etch stop material on the insulating layer and the semiconductor layer, and performing a third mask process to the etch stop material for forming the first through hole and the second through hole; and (E) disposing a second metal layer on the etch stop layer, in the first through hole and in the second through hole, then disposing a third metal layer on the second metal layer, and performing a fourth mask process on the second metal layer and the third metal layer for forming the source electrode, the drain electrode and the electrode layer, wherein the source electrode and the drain electrode are both corresponding to the second metal layer, and the first electrode portion and the second electrode portion of the electrode layer are both corresponding to the third metal layer.

In the above method of fabricating the thin film transistor array panel, the method further comprising receiving cavities formed in the etch stop layer, wherein the receiving cavities are configured to receive at least one part of the source electrode, at least one part of the drain electrode and at least one part of the electrode layer.

In the above method of fabricating the thin film transistor array panel, the step (D) comprises: disposing the etch stop material on the insulating layer and the semiconductor layer, and performing the third mask process on the etch stop material for forming the first through hole, the second through hole and the receiving cavities.

In the above method of fabricating the thin film transistor array panel, the semiconductor layer comprises indium gallium zinc oxide; and the etch stop layer is configured to protect the semiconductor layer from water vapor or oxygen gas affecting an electrical stability of the indium gallium zinc oxide.

In the above method of fabricating the thin film transistor array panel, the method further comprises the following step of: etching the second metal layer and the third metal layer at the same time by a copper etching solution of a hydrogen peroxide system after the fourth mask process is performed.

In comparison with the conventional technique, the present invention can simplify the fabricating process of the thin film transistor array panel and reduce the fabricating cost.

To make the above description of the present invention more clearly comprehensible, it is described in detail below in examples of preferred embodiments with the accompanying drawings.

DETAILED DESCRIPTION OF THE PREFERRED EMBODIMENTS

The term "an embodiment", as used in this specification, means an instance, an example, or an illustration. In addition, the article "a", as used in this specification and the appended claims, can be interpreted generally as "one or more than one" unless specified otherwise or a singular form can be clearly determined from a context.

A thin film transistor array panel of the present invention can be applied in a display panel, wherein the display panel can be a thin film transistor liquid crystal display (TFT-LCD), an organic light emitting diode (OLED), and so on.

A thin film transistor array panel of the present invention can be applied in an array panel of the thin film transistor liquid crystal display. In this case, a second electrode portion 504 of an electrode layer of the thin film transistor array panel can be a strip-shape electrode, and the thin film transistor array panel is used in the thin film transistor liquid crystal display panel which is constructed by a liquid crystal layer and a color filter array panel.

A thin film transistor array panel of the present invention can be also used in an array panel of the organic light emitting diode. In this case, a second electrode portion 504 of an electrode layer of the thin film transistor array panel can be a cathode layer, and the thin film transistor array panel is used in the organic light emitting diode which is constructed by an organic emitting material layer and a cathode layer.

Figure 1:
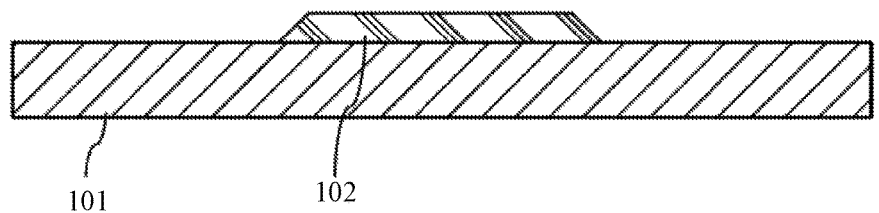
FIGS. 1-5 are schematic diagrams of a method of fabricating a thin film transistor array panel of the present invention.
Figure 2:
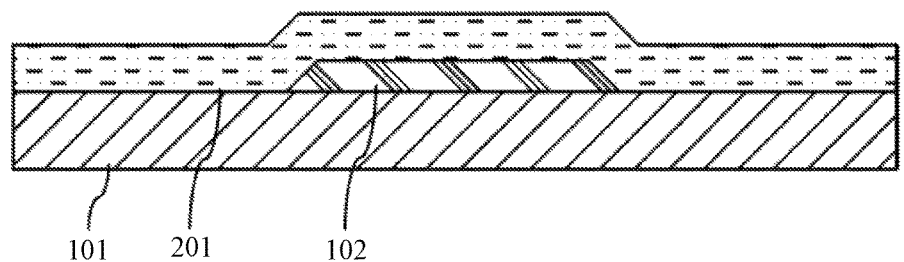
Figure 3:
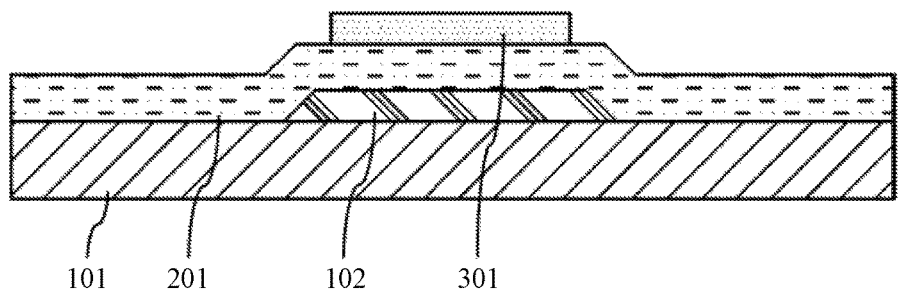
Figure 4:
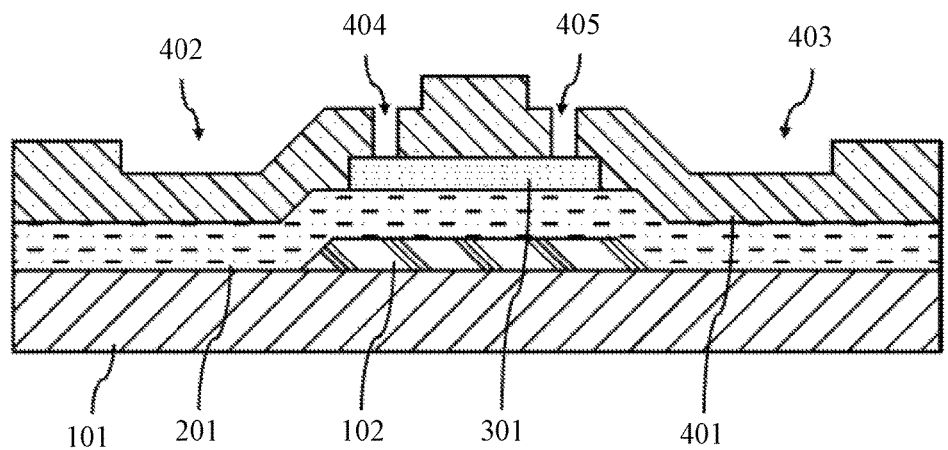
Figure 5:
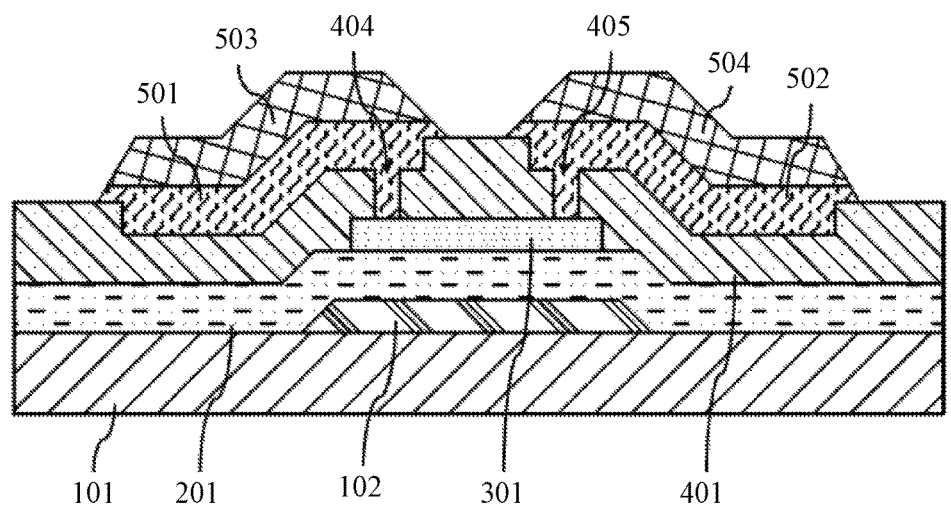

Please refer to FIG. 5, a thin film transistor array panel of the present invention includes a substrate 101, a scanning line, a thin film transistor, an insulating layer 201, an etch stop layer 401, a data line, and an electrode layer.

Wherein the scan line and the data line are both connected with the thin film transistor, and the thin film transistor is connected with the electrode layer.

The thin film transistor includes a gate electrode 102, a semiconductor layer 301, a source electrode 501, and a drain electrode 502.

The insulating layer 201 is disposed on the gate electrode 102 and the substrate 101. The etch stop layer 401 is disposed on the semiconductor layer 301 and the insulating layer 201. The electrode layer comprises a first electrode portion 503 and a second electrode portion 504. The first electrode portion 503 is disposed on the source electrode 501 and configured to cover and protect the source electrode 501, wherein the first electrode portion 503 contacts with the source electrode 501. The second electrode portion 504 is disposed on the drain electrode 502 and configured to cover and protect the drain electrode 502, wherein the second electrode portion 504 contacts with the drain electrode 502.

The semiconductor layer 301 is disposed on the insulating layer 201. The etch stop layer 401 has a first through hole 401 and a second through hole 405, and the source electrode 501 and the drain electrode 502 are connected with the semiconductor layer 301 through the first through hole 404 and the second through hole 405 respectively.

In a thin film transistor array panel of the present invention, the gate electrode 102 and the scan line are formed by disposing a first metal layer on the substrate 101 and performing a first mask process on the first metal layer. Specifically, the gate electrode 102 and the scan line are both formed by performing a first mask process on the first metal layer and etching the first metal layer.

The semiconductor layer 301 is formed by disposing a semiconductor material on the insulating layer 201 and performing a second mask process on the semiconductor material. Specifically, the semiconductor layer 301 is formed by performing a second mask process to the semiconductor material and etching the semiconductor material.

The first through hole 404 and the second through hole 405 are formed by disposing an etch stop material on the insulating layer 201 and the semiconductor layer 301 and performing a third mask process on the etch stop material. Receiving cavities (402, 403) are formed in the etch stop layer 401, wherein the receiving cavities (402, 403) are configured to receive at least one part of the source electrode 501, at least one part of the drain electrode 502 and at least one part of the electrode layer. The receiving cavities (402, 403) are formed by performing the third mask process on the etch stop material. Namely, the first through hole 404, the second through hole 405, and the receiving cavities (402, 403) are all formed by the same mask process (the third mask process). Specifically, the first through hole 404, the second through hole 405, and the receiving cavities (402, 403) are formed by performing the third mask process to the etch stop material and etching the etch stop material.

The source electrode 501, the drain electrode 502, the data line, and the electrode layer are formed by disposing a second metal layer on the etch stop layer 401, in the first through hole 404 and in the second through hole 405, respectively, then disposing a third metal layer on the second metal layer and performing a fourth mask process on the second metal layer and the third metal layer, wherein the source electrode 501, the drain electrode 502, and the data line are all corresponding to the second metal layer, and the first electrode portion 503 and the second electrode portion 504 of the electrode layer are both corresponding to the third metal layer. After the fourth mask process is performed, the second metal layer and the third metal layer can be etched at the same time by a copper etching solution of a hydrogen peroxide system. A channel between the source electrode 501 and the drain electrode 502 is configured to isolate the source electrode 501 from the drain electrode 502 and isolate the first electrode portion 503 from the second electrode portion 504. Namely, the channel is configured to isolate a first entirety constructed by the source electrode 501 and the first electrode portion 503 from a second entirety constructed by the drain electrode 502 and the second electrode portion 504. The channel is formed by performing the fourth mask process on the second metal layer and the third metal layer, and etching the second metal layer and the third metal layer.

By the above technique solution, a protective layer/a passivation layer can be saved in the thin film transistor array panel, and a mask process required for fabricating the protective layer/the passivation layer is simultaneously saved. Furthermore, since the electrode layer, the source electrode, and the drain electrode are all formed in the same mask process, two mask processes can be combined into a single mask process. Namely, a mask process is saved. Namely, the above technique solution is beneficial to save (reduce) the mask processes required for fabricating the thin film transistor array panel from six to four.

In a thin film transistor array panel of the present invention, the semiconductor layer 301 comprises indium gallium zinc oxide. Namely, the semiconductor material consists of the indium gallium zinc oxide. The semiconductor layer 301 can further comprise amorphous silicon, low-temperature polysilicon, and so on.

In a thin film transistor array panel of the present invention, the etch stop layer 401 is configured to protect the semiconductor layer 301 from water vapor or oxygen gas affecting an electrical stability of the semiconductor layer 301 (the indium gallium zinc oxide).

Figure 6:
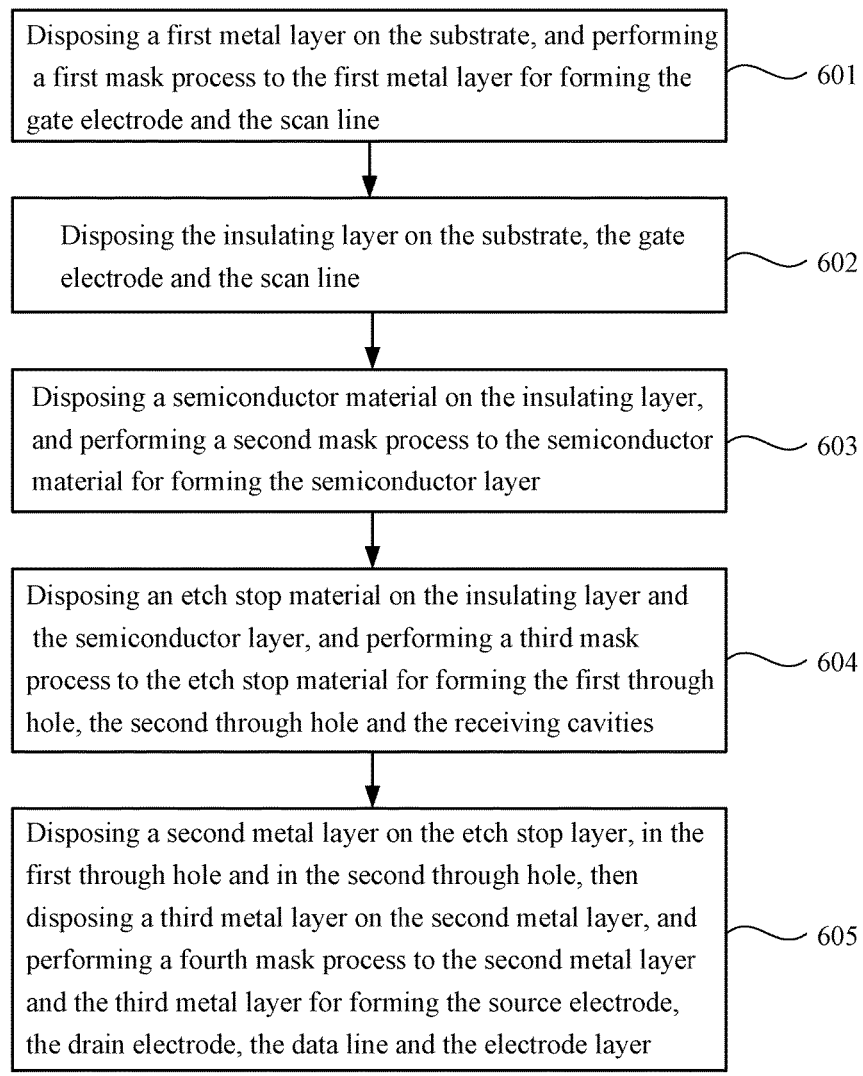
FIG. 6 is a flow chart of a method of fabricating a thin film transistor array panel of the present invention.

Referring to FIGS. 1 to 6, FIGS. 1-5 are schematic diagrams of a method of fabricating a thin film transistor array panel of the present invention. FIG. 6 is a flow chart of a method of fabricating a thin film transistor array panel of the present invention.

A method of fabricating a thin film transistor array panel comprises the following steps of:

(A) (step 601) disposing a first metal layer on the substrate 101, and performing a first mask process on the first metal layer for forming the gate electrode 102 and the scan line. Specifically, the first metal layer is disposed on the substrate 101, the first mask process is performed to the first metal layer, and the first metal layer is etched, so as to form the gate electrode 102 and the scan line;

(B) (step 602) disposing the insulating layer 201 on the substrate 101, the gate electrode 102 and the scan line;

(C) (step 603) disposing a semiconductor material on the insulating layer 201, and performing a second mask process on the semiconductor material for forming the semiconductor layer 301. Specifically, the semiconductor material is disposed on the insulating layer 201, a second mask process is performed to the semiconductor material, and the semiconductor material is etched to form the semiconductor layer 301;

(D) (step 604) disposing an etch stop material on the insulating layer 201 and the semiconductor layer 301, and performing a third mask process to the etch stop material for forming the first through hole 404 and the second through hole 405. Specifically, an etch stop material is disposed on the insulating layer 201 and the semiconductor layer 301, a third mask process is performed to the etch stop material, and the etch stop material is etched to form the first through hole 404 and the second through hole 405; and (E) (step 605) disposing a second metal layer on the etch stop layer 401, in the first through hole 404 and in the second through hole 405, then disposing a third metal layer on the second metal layer, and performing a fourth mask process to the second metal layer and the third metal layer for forming the source electrode 501, the drain electrode 502, the data line and the electrode layer, wherein the source electrode 501, the drain electrode 502 and the data line are all corresponding to the second metal layer, and the first electrode portion 503 and the second electrode portion 504 of the electrode layer are both corresponding to the third metal layer. The first electrode portion 503 is disposed on the source electrode 501 and configured to cover and protect the source electrode 501, wherein the first electrode portion 503 contacts with the source electrode 501. The second electrode portion 504 is disposed on the drain electrode 502 and configured to cover and protect the drain electrode 502, wherein the second electrode portion 504 contacts with the drain electrode 502.

Specifically, the second metal layer is disposed on the etch stop layer, in the first through hole 404 and in the second through hole 405, then a third metal layer is disposed on the second metal layer, a fourth mask process is performed to the second metal layer and the third metal layer, so as to form the source electrode 501, the drain electrode 502, the data line, and the electrode layer, wherein the second metal layer and the third metal layer are etched at the same time by a copper etching solution of a hydrogen peroxide system after the fourth mask process is performed.

Used as a kind of improvement, receiving cavities (402, 403) are formed in the etch stop layer 401, wherein the receiving cavities (402, 403) are configured to receive at least one part of the source electrode 501, at least one part of the drain electrode 502 and at least one part of the electrode layer.

In a method of fabricating a thin film transistor array panel of the present invention, the step (D) comprises:

disposing the etch stop material on the insulating layer 201 and the semiconductor layer 301, and performing the third mask process to the etch stop material for forming the first through hole 404, the second through hole 405, and the receiving cavities (402, 403).

By the above technical solution, a protective layer/a passivation layer can be saved in the thin film transistor array panel, and a mask process required for fabricating the protective layer/the passivation layer is simultaneously saved. Furthermore, since the electrode layer, the source electrode, and the drain electrode are all formed in the same mask process, two mask processes can be combined into a single mask process. Namely, a mask process is saved. Namely, the above technique solution is beneficial to save (reduce) the mask processes required for fabricating the thin film transistor array panel from six to four.

In a method of fabricating a thin film transistor array panel of the present invention, the semiconductor layer 301 comprises indium gallium zinc oxide. Namely, the semiconductor material consists of the indium gallium zinc oxide. The semiconductor layer 301 can further comprise amorphous silicon, low-temperature polysilicon, and so on.

In a method of fabricating a thin film transistor array panel of the present invention, the etch stop layer 401 is configured to protect the semiconductor layer 301 from water vapor or oxygen gas affecting an electrical stability of the semiconductor layer 301 (the indium gallium zinc oxide).

Although the present invention has been shown and described relative to one or more implementations, those skilled in the art will expect the equivalent variations and modifications based on reading and understanding the present specification and appended figures. The present invention includes all of the modifications and variations, and is only limited to the scope of the appended claims. In particular, for various functions performed by the above described components, these terms, which are used to describe these components, are intended to correspond to any components (unless otherwise indicated) which performed specific functions of the components (for example, which are equivalent in function), even that they, in structure, are not equal to the disclosing structures which performs the functions in the exemplary embodiments of the present specification described herein. Furthermore, although specific features of the present specification have been disclosed with respect to only one of several implementations, such features may be combined with, such as one or more other features of other implementations which may be expected or advantageous for given or particular applications. Furthermore, the terms "include", "have", "composed of" or other variants as used in the embodiments or claims are intends to be comprised in the same manner as the term "include".

As described above, although the present invention has been described in preferred embodiments, they are not intended to limit the invention. One of ordinary skill in the art, without departing from the spirit and scope of the invention within, can make various modifications and variations, so the range of the scope of the invention is defined by the claims.

What is claimed is:

1. A thin film transistor array panel, comprising:
   a substrate;
   a thin film transistor, comprising:
      a gate electrode;
      a semiconductor layer;
      a source electrode; and
      a drain electrode;
   an insulating layer disposed on the gate electrode and the substrate;
   an etch stop layer disposed on the semiconductor layer and the insulating layer;
   an electrode layer, comprising a first electrode portion and a second electrode portion, wherein the first electrode portion is disposed on the source electrode and configured to cover and protect the source electrode, and the second electrode portion is disposed on the drain electrode and configured to cover and protect the drain electrode;
   wherein the semiconductor layer is disposed on the insulating layer, the etch stop layer has a first through hole and a second through hole, and the source electrode and the drain electrode are connected with the semiconductor layer through the first through hole and the second through hole respectively;
   wherein the gate electrode is formed by disposing a first metal layer on the substrate and performing a first mask process on the first metal layer;
   wherein the semiconductor layer is formed by disposing a semiconductor material on the insulating layer and performing a second mask process on the semiconductor material;
   wherein the first through hole and the second through hole are formed by disposing an etch stop material on the insulating layer and the semiconductor layer and performing a third mask process on the etch stop material;
   wherein the source electrode, the drain electrode and the electrode layer are formed by disposing a second metal layer on the etch stop layer, in the first through hole and in the second through hole, respectively, then disposing a third metal layer on the second metal layer and performing a fourth mask process to the second metal layer and the third metal layer, wherein the source electrode and the drain electrode are both corresponding to the second metal layer, and the first electrode portion and the second electrode portion of the electrode layer are both corresponding to the third metal layer; and
   wherein a channel between the source electrode and the drain electrode is configured to isolate a first entirety constructed by the source electrode and the first electrode portion from a second entirety constructed by the drain electrode and the second electrode portion.

2. The thin film transistor array panel according to claim 1, further comprising receiving cavities formed in the etch stop layer, wherein the receiving cavities are configured to receive at least one part of the source electrode, at least one part of the drain electrode, and at least one part of the electrode layer.

3. The thin film transistor array panel according to claim 2, wherein the receiving cavities are formed by performing the third mask process to the etch stop material.

4. The thin film transistor array panel according to claim 1, wherein the semiconductor layer comprises indium gallium zinc oxide.

5. The thin film transistor array panel according to claim 4, wherein the etch stop layer is configured to protect the semiconductor layer from water vapor or oxygen gas affecting an electrical stability of the indium gallium zinc oxide.

6. The thin film transistor array panel according to claim 1, wherein the channel is formed by performing the fourth mask process on the second metal layer and the third metal layer, and etching the second metal layer and the third metal layer.

7. A thin film transistor array panel, comprising:
   a substrate;
   a thin film transistor, comprising:
      a gate electrode;
      a semiconductor layer;
      a source electrode; and
      a drain electrode;
   an insulating layer disposed on the gate electrode and the substrate;
   an etch stop layer disposed on the semiconductor layer and the insulating layer;
   an electrode layer, comprising a first electrode portion and a second electrode portion, wherein the first electrode portion is disposed on the source electrode and configured to cover and protect the source electrode, and the second electrode portion is disposed on the drain electrode and configured to cover and protect the drain electrode;
   wherein the semiconductor layer is disposed on the insulating layer, the etch stop layer has a first through hole and a second through hole, and the source electrode and the drain electrode are connected with the semiconductor layer through the first through hole and the second through hole respectively; and
   wherein a channel between the source electrode and the drain electrode is configured to isolate a first entirety constructed by the source electrode and the first electrode portion from a second entirety constructed by the drain electrode and the second electrode portion.

8. The thin film transistor array panel according to claim 7, wherein the semiconductor layer comprises indium gallium zinc oxide.

9. The thin film transistor array panel according to claim 8, wherein the etch stop layer is configured to protect the semiconductor layer from water vapor or oxygen gas affecting an electrical stability of the indium gallium zinc oxide.

10. The thin film transistor array panel according to claim 7, wherein the channel is formed by performing the fourth mask process to the second metal layer and the third metal layer, and etching the second metal layer and the third metal layer.

11. A method of fabricating a thin film transistor array panel according to claim 7, wherein the method comprises the following steps of:
   (A) disposing a first metal layer on the substrate, and performing a first mask process on the first metal layer for forming the gate electrode;
   (B) disposing the insulating layer on the substrate and the gate electrode;
   (C) disposing a semiconductor material on the insulating layer, and performing a second mask process on the semiconductor material for forming the semiconductor layer;
   (D) disposing an etch stop material on the insulating layer and the semiconductor layer, and performing a third mask process on the etch stop material for forming the first through hole and the second through hole; and
   (E) disposing a second metal layer on the etch stop layer, in the first through hole and in the second through hole, then disposing a third metal layer on the second metal layer, and performing a fourth mask process on the second metal layer and the third metal layer for forming the source electrode, the drain electrode and the electrode layer, wherein the source electrode and the drain electrode are both corresponding to the second metal layer, and the first electrode portion and the second electrode portion of the electrode layer are both corresponding to the third metal layer.

12. The method of fabricating the thin film transistor array panel according to claim 11, further comprising receiving cavities formed in the etch stop layer, wherein the receiving cavities are configured to receive at least one part of the source electrode, at least one part of the drain electrode, and at least one part of the electrode layer.

13. The method of fabricating the thin film transistor array panel according to claim 12, wherein the step (D) comprises:
   disposing the etch stop material on the insulating layer and the semiconductor layer, and performing the third mask process on the etch stop material for forming the first through hole, the second through hole and the receiving cavities.

14. The method of fabricating the thin film transistor array panel according to claim 11, wherein the semiconductor layer comprises indium gallium zinc oxide; and
   the etch stop layer is configured to protect the semiconductor layer from water vapor or oxygen gas affecting an electrical stability of the indium gallium zinc oxide.

15. The method of fabricating the thin film transistor array panel according to claim 11, further comprising the following step of:
   etching the second metal layer and the third metal layer at the same time by a copper etching solution of a hydrogen peroxide system after the fourth mask process is performed.

* * * * *